(12) United States Patent
Kamins

(10) Patent No.: US 7,190,075 B2
(45) Date of Patent: Mar. 13, 2007

(54) METHOD OF FORMING SMOOTH POLYCRYSTALLINE SILICON ELECTRODES FOR MOLECULAR ELECTRONIC DEVICES

(75) Inventor: Theodore I. Kamins, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/127,917

(22) Filed: May 11, 2005

(65) Prior Publication Data

US 2005/0200020 A1 Sep. 15, 2005

Related U.S. Application Data

(60) Division of application No. 10/423,090, filed on Apr. 24, 2003, now Pat. No. 6,916,740, which is a continuation-in-part of application No. 09/891,491, filed on Jun. 25, 2001, now abandoned.

(51) Int. Cl.
*H01L 23/48* (2006.01)

(52) U.S. Cl. .................................................... 257/741
(58) Field of Classification Search ................. 257/741
See application file for complete search history.

(56) References Cited

U.S. PATENT DOCUMENTS

| 5,843,829 A | 12/1998 | Kuramae et al. ............ 438/395 |
| 5,869,389 A | 2/1999 | Ping et al. .................. 438/486 |
| 6,128,214 A | 10/2000 | Kuekes et al. .............. 365/151 |
| 6,314,019 B1 | 11/2001 | Kuekes et al. .............. 365/151 |
| 6,395,610 B1 | 5/2002 | Roy et al. ................... 438/354 |
| 6,459,095 B1 * | 10/2002 | Heath et al. .................. 257/14 |
| 6,777,274 B2 | 8/2004 | Moon et al. |
| 2005/0014304 A1 * | 1/2005 | Moon et al. .................. 438/30 |

OTHER PUBLICATIONS

C.P. Collier et al., "Electronically Configurable Molecular-Based Logic Gates", Science, vol. 285, pp. 391-393 (Jul. 16, 1999).
C.P. Collier et al, "A [2]Catenane-Based Solid State Electronically Reconfigurable Switch", Science, vol. 289, pp. 1172-1175 (Aug. 18, 2000).
M. Sternheim et al, "Properties of Thermal Oxides Grown on Phosphorus In Situ Doped Polysilicon", Journal of Electrochemical Society, vol. 130, No. 8, pp. 1735-1740 (Aug. 1983).
E. Ibok et al, "A Characterization of the Effect of Deposition Temperature on Polysilicon Properties", Electrochemical Society, vol. 140, No. 10, pp. 2927-2937 (Oct. 1993).

(Continued)

*Primary Examiner*—Roy Potter

(57) ABSTRACT

A method is provided for forming smooth polycrystalline silicon electrodes for molecular electronic devices. The method comprises: depositing a silicon layer in an amorphous form; forming a native oxide on a surface of the amorphous silicon layer at a temperature between room temperature to 500° C.; and converting the amorphous silicon to polycrystalline silicon by heat-treating at a temperature in a range of 600° to 800° C. for a period of time in a range of 1 minute to 24 hrs, with higher temperatures associated with shorter times, in an inert atmosphere. The method converts the amorphous form of silicon to the higher conductivity polycrystalline form, while retaining the smoothness associated with the amorphous form.

10 Claims, 2 Drawing Sheets

OTHER PUBLICATIONS

T. Kamins, "Polycrystalline Silicon for Integrated Circuit Applications", p. 148, Kluwer Academic, Boston, MA (1988).

S. Wolf et al., "Silicon Processing for the VLSI ERA", vol. 1 ("Process Technology"), pp. 303-308, Lattice Press, Sunset Beach, CA, 1986.

* cited by examiner

METHOD OF FORMING SMOOTH POLYCRYSTALLINE SILICON ELECTRODES FOR MOLECULAR ELECTRONIC DEVICES

CROSS-REFERENCE TO RELATED APPLICATIONS

The present application is a divisional of application Ser. No. 10/423,090, filed Apr. 24, 2003, now U.S. Pat. No. 6,916,740 which in turn is a continuation-in-part of application Ser. No. 09/891,491, filed on Jun. 25, 2001, now abandoned.

The present application is related to application Ser. No. 09/280,048, entitled "Chemically Synthesized and Assembled Electronic Devices", filed on Mar. 29, 1999, which is directed to the formation of nanowires used for nanoscale computing and memory circuits, now U.S. Pat. No. 6,459,095, issued Oct. 2, 2002. The present application is also related to application Ser. No. 09/280,225, entitled "Molecular Wire Crossbar Interconnect (MWCI) for Signal Routing and Communications", now U.S. Pat. No. 6,314,019, issued Nov. 6, 2001, Ser. No. 09/280,045, entitled "Molecular Wire Crossbar Logic (MWCL)", and Ser. No. 09/280,188, entitled "Molecular Wire Transistor (MWT)", all also filed on Mar. 29, 1999, and to U.S. Pat. No. 6,128,214, entitled "Molecular Wire Crossbar Memory", issued on Oct. 3, 2000, which are all directed to various aspects of memory and logic circuits utilized in nanocomputing. The present application is also related to application Ser. No. 09/823,195, filed Mar. 29, 2001. The foregoing references are all incorporated herein by reference.

TECHNICAL FIELD

The present application is generally directed to nanoscale computing and memory circuits, and, more particularly, to the formation of nanowires for device applications, specifically, to the fabrication of polycrystalline silicon ("polysilicon") nanowires.

BACKGROUND ART

With the constantly decreasing feature sizes of integrated-circuit devices, well-behaved devices are becoming increasingly difficult to design. The fabrication is also becoming increasingly difficult and expensive. In addition, the number of electrons within a device is decreasing, with increasing statistical fluctuations in the electrical properties. In the limit, device operation depends on a single electron, and traditional device concepts must change.

Molecular electronics have the potential to augment or even replace conventional devices by molecular electronic elements, can be altered by externally applied voltages, and have the potential to scale from micron-size dimensions to nanometer-scale dimensions with little change in the device concept. The molecular switching elements can be formed by inexpensive solution techniques; see, e.g., C. P. Collier et al, "Electronically Configurable Molecular-Based Logic Gates", *Science*, Vol. 285, pp. 391–394 (16 Jul. 1999) and C. P. Collier et al, "A [2] Catenane-Based Solid State Electronically Reconfigurable Switch", *Science*, Vol. 289, pp. 1172–1175 (18 Aug. 2000). The self-assembled switching elements may be integrated on top of a Si integrated circuit so that they can be driven by conventional Si electronics in the underlying substrate. To address the switching elements, interconnections or wires are used.

Molecular electronic devices, comprising crossed wire switches, hold promise for future electronic and computational devices. Thin single or multiple monomolecular layers can be formed, for example, by Langmuir-Blodgett techniques. A very smooth underlying surface is needed to allow optimal LB film formation. A crossed wire switch may comprise two nanowires, or electrodes, for example, with a molecular switching species between the two electrodes.

Semiconducting electrodes, for example, silicon, are especially useful in such devices. In some cases, the electronic properties of the resulting device can be influenced by the energy band structure of the semiconducting electrode. In addition, using silicon is attractive for compatibility and interfacing with silicon integrated-circuit electronics. Polycrystalline silicon may be especially useful because it can be formed on top of and electrically isolated from the silicon substrate, which can then contain conventional electronic devices.

Therefore, a method of forming polycrystalline silicon electrodes with very smooth surfaces is needed. When polycrystalline silicon is deposited by conventional methods in the polycrystalline form, such as by low pressure chemical vapor deposition (LPCVD) at 0.2 Torr and 625° C. using $SiH_4$, the surface is rough because of the crystalline grains formed during the deposition process; see, e.g., M. Sternheim et al, "Properties of Thermal Oxides Grown on Phosphorus In Situ Doped Polysilicon", *Journal of Electrochemical Society*, Vol. 130, No. 8, pp. 1735–1740 (August 1983). If the silicon layer is deposited in the amorphous form (e.g., LPCVD at 0.2 Torr and 525° to 550° C. using $SiH_4$), then the surface is very smooth; see, e.g., E. Ibok et al, "A Characterization of the Effect of Deposition Temperature on Polysilicon Properties", *Journal of Electro-chemical Society*, Vol. 140, No. 10, pp. 2927–2937 (October 1993); and T. Kamins, *Polycrystalline Silicon for Integrated Circuit Applications*, p. 148, Kluwer Academic, Boston, Mass. (1988).

What is needed is a process to convert the amorphous form of silicon to the more electrically conductive polycrystalline form, while retaining the smoothness associated with the amorphous form. By "smooth" herein is meant that the rms surface roughness is less than, for example, about 2% of the polycrystalline silicon film thickness.

DISCLOSURE OF INVENTION

In accordance with the embodiments herein, a method is provided for forming smooth polycrystalline silicon electrodes for molecular electronic devices. The method comprises:
 (a) depositing a silicon layer in an amorphous form;
 (b) forming a native oxide on a surface of the amorphous silicon layer, the native oxide formed by exposing the surface to an oxidizing species for a period of time at a temperature between room temperature and 500° C.;
 (c) converting the amorphous silicon to polycrystalline silicon by heat-treating at a temperature in a range of 600° to 800° C. for a period of time in a range of 1 minute to 24 hrs, with higher temperatures associated with shorter times, in an inert atmosphere to thereby form the smooth polycrystalline silicon electrodes.

Additionally, a method of fabricating crossed wire molecular electronic devices having smooth silicon electrodes is provided. The method comprises:
 depositing a silicon layer in an amorphous form, the silicon layer having a thickness within a range of about 10 nm to 2 µm;

forming a native oxide on a surface of the amorphous silicon layer, the native oxide is formed by exposing the surface to an oxidizing species for a period of time at a temperature between room temperature and 500° C.;

converting the amorphous silicon to polycrystalline silicon by heat-treating at a temperature in a range of 600° to 800° C. for a period of time in a range of 1 minute to 24 hrs, with higher temperatures associated with shorter times, in an inert atmosphere;

implanting dopant atoms into the polycrystalline silicon or adding the dopant from a gas phase, wherein the dopant atoms are added either during the depositing step or prior to or after the converting step;

activating the dopant atoms;

patterning the polycrystalline layers to form the silicon electrodes;

removing the native oxide layer;

depositing a layer of switch molecules on the silicon electrodes; and forming electrodes at a non-zero angle with respect to the silicon electrodes over the layer of switch molecules to form the crossed wire molecular electronic devices.

The methods disclosed and claimed herein converts the amorphous form of silicon to the polycrystalline form, while retaining the smoothness associated with the amorphous form.

BEST MODES FOR CARRYING OUT THE INVENTION

Definitions

Figure 1A:
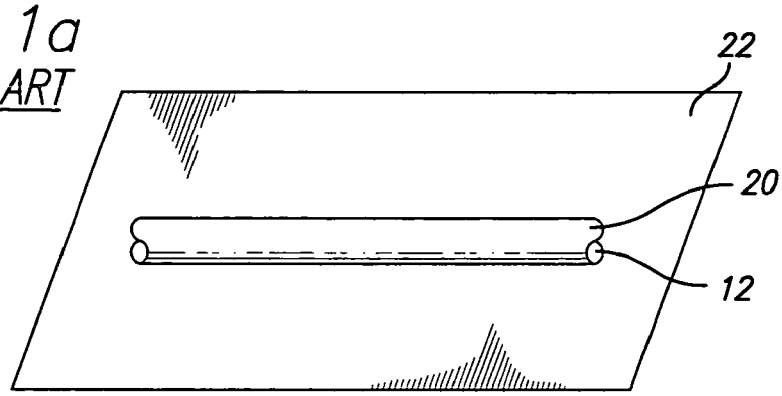
FIGS. 1a–1c are a schematic representation of the steps that use nanometer-scale diameter wires to form a chemically-fabricated crossed wire switch.

As used herein, the term "self-aligned" as applied to "junction" means that the junction that forms the switch and/or other electrical connection between two wires is created wherever two wires, either of which may be coated or functionalized, cross each other, because it is the act of crossing that creates the junction.

The term "self-assembled" as used herein refers to a system that naturally adopts some geometric pattern because of the identity of the components of the system; the system achieves at least a local minimum in its energy by adopting this configuration.

The term "singly configurable" means that a switch can change its state only once via an irreversible process such as an oxidation or reduction reaction; such a switch can be the basis of a programmable read-only memory (PROM), for example.

The term "reconfigurable" means that a switch can change its state multiple times via a reversible process such as an oxidation or reduction; in other words, the switch can be opened and closed multiple times, such as the memory bits in a random access memory (RAM).

The term "bi-stable" as applied to a molecule means a molecule having two relatively low energy states. The molecule may be either irreversibly switched from one state to the other (singly configurable) or reversibly switched from one state to the other (reconfigurable).

"Micron-scale dimensions" refers to dimensions that range from 1 micrometer to a few micrometers in size.

"Sub-micron scale dimensions" refers to dimensions that range from 1 micrometer down to 0.05 micrometers.

"Nanometer scale dimensions" refers to dimensions that range from 0.1 nanometers to 50 nanometers (0.05 micrometers).

"Micron-scale wires" refers to rod or ribbon-shaped conductors or semiconductors with widths or diameters having the dimensions of 1 to 10 micrometers, heights that can range from a few tens of nanometers to a micrometer, and lengths of several micrometers and longer.

"Nanometer-scale wires" refers to rod or ribbon-shaped conductors or semiconductors with widths or diameters having the dimension of 1 to 50 nanometers, heights that can range from 0.3 to 100 nanometers, and lengths up to several micrometers or more.

Crossed Wire Switches

The description which follows is directed to the formation of micrometer scale and nanometer scale crossed wire switches, (1) using a reduction-oxidation (redox) reaction to form an electrochemical cell or (2) using electric field (E-field) induced band gap changes to form molecular switches or (3) using rearrangement of electronic charges. In either case, the molecular switches typically have two states, and may be either irreversibly switched from a first state to a second state or reversibly switched from a first state to a second state. In the latter case, there are two possible conditions: (1) either the electric field may be removed after switching into a given state, and the molecule will remain in that state ("latched") until a reverse field is applied to switch the molecule back to its previous state, or (2) removal of the electric field would cause the molecule to revert to its previous state, and hence the field must be maintained in order to keep the molecule in the switched state until it is desired to switch the molecule to its previous state.

The crossed wire switch based on the redox reaction approach is disclosed and claimed in the above-identified U.S. Pat. No. 6,459,095. Examples of molecules used in the redox reaction approach include rotaxanes, pseudo-rotaxanes, catenanes, and spiropyrans.

The crossed wire switch based on the E-field induced band gap change is disclosed and claimed in patent application Ser. No. 09/823,195, filed Mar. 29, 2001, which is incorporated herein by reference. Examples of molecules used in the E-field induced band gap change approach include molecules that evidence:

(1) molecular conformation change or an isomerization;

(2) change of extended conjugation via chemical bonding change to change the band gap; or (3) molecular folding or stretching.

Changing of extended conjugation via chemical bonding change to change the band gap may be accomplished in one of the following ways:

(2a) charge separation or recombination accompanied by increasing or decreasing band localization; or (2b) change of extended conjugation via charge separation or recombination and $\pi$-bond breaking or formation.

Figure 1B:
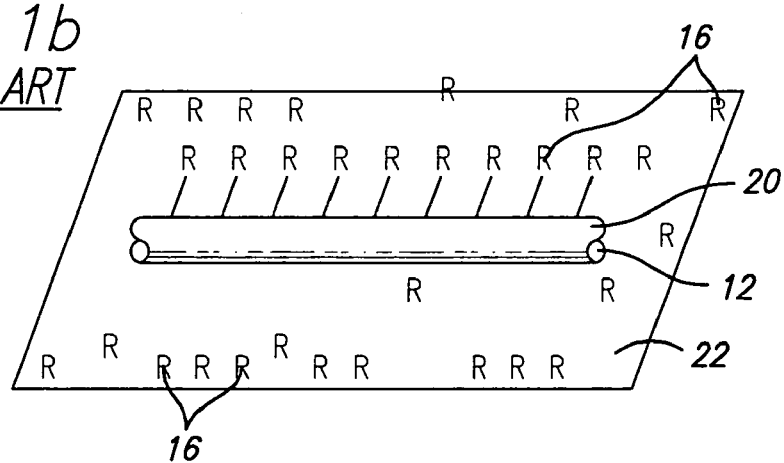
Figure 1C:
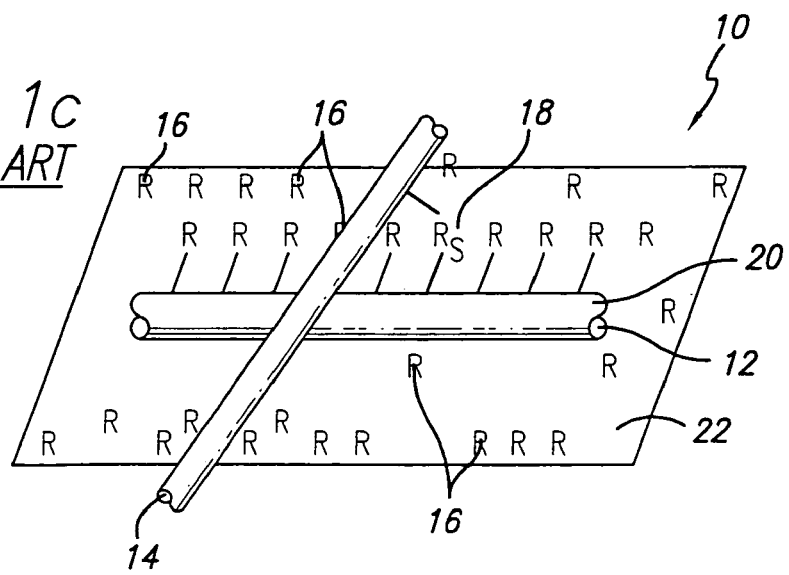

Although the description of FIGS. 1a–1c is presented in terms of the redox reaction approach, it will be readily apparent to those skilled in this art that the teachings of the present invention are equally applicable to the E-field induced band gap change approach, rearrangement of electronic charges, etc.

The essential device features of a crossed wire switch 10 are shown in FIG. 1c. The crossed wire switch 10 comprises two wires, or electrodes, 12, 14, each either a metal or semiconductor wire, that are crossed at some non-zero angle. In between those wires is a layer of molecules or molecular compounds 16, denoted R in FIGS. 1b–1c. The particular molecules 18 (denoted $R_s$) that are sandwiched at the intersection of the two wires 12, 14 are identified as switch molecules. When an appropriate voltage is applied across the wires, the switch molecules are either oxidized or reduced. When a molecule is oxidized (reduced), then a second species is reduced (oxidized) so that charge is balanced. These two species are then called a redox pair. One example of this device would be for one molecule to be reduced, and then a second molecule (the other half of the redox pair) is oxidized. In another example, a molecule is reduced, and one of the wires is oxidized. In a third example, a molecule is oxidized, and one of the wires is reduced. In a fourth example, one wire is oxidized, and an oxide associated with the other wire is reduced. In all cases, oxidation or reduction will affect the tunneling distance or the tunneling barrier height between the two wires, thereby exponentially altering the rate of charge transport across the wire junction, and serving as the basis for a switch.

Devices 10 (micrometer scale, sub-micrometer scale, or nanometer scale) made from redox pairs may be prepared according to the method depicted in FIGS. 1a–1c. In this case, a semiconductor (i.e., silicon) nanowire 12, possibly with an insulating surface layer 20 (for silicon, this is the naturally occurring $SiO_x$; where x=1–2) is deposited on a substrate 22, as illustrated in FIG. 1a. The substrate 22 is electrically insulating, and may comprise any of the substrate materials commonly employed in semiconductor fabrication, such as, but not limited to, undoped (i.e., not intentionally doped) semiconductor, silicon nitride, amorphous silicon dioxide (i.e., glass or fused silica), crystalline silicon dioxide (i.e., quartz), sapphire, and the like, either in bulk form (the entire substrate) or in film form (film grown or deposited on a semiconductor substrate, such as silicon, gallium arsenide, etc.).

Second, a redox pair of molecules 16 (labeled R in FIG. 1b) is transferred as either a Langmuir-Blodgett film, or via some other form of deposition such as vacuum sublimation. The redox pair 16 can cover both the wire 12 and the substrate 22.

In the last step, either a metal or a semiconductor nanowire 14, possibly with an insulating layer (not shown), is deposited across the first wire 12. Only those redox pairs 18 that are sandwiched between the two wires 12, 14 are defined, or can function, as molecular switches 10, as illustrated in FIG. 1c.

In one approach, the silicon nanowire 12 is first formed as a layer on the substrate 22, and is subsequently patterned into individual electrodes. In particular, amorphous silicon is first deposited on the substrate 22, is converted into polycrystalline silicon ("polysilicon"), and then patterned. Alternatively, the silicon layer 12 can be patterned before crystallization.

Figure 2A:
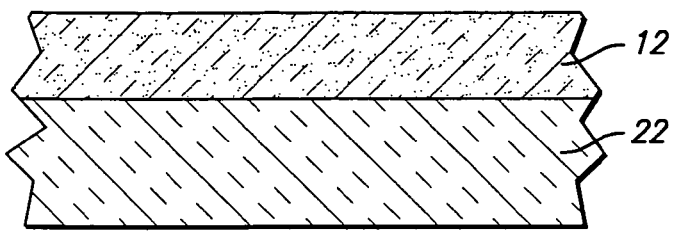
FIGS. 2a–2e are cross-sectional views, depicting the conversion of amorphous silicon to polycrystalline silicon and the formation of electrodes therefrom.
Figure 2B:
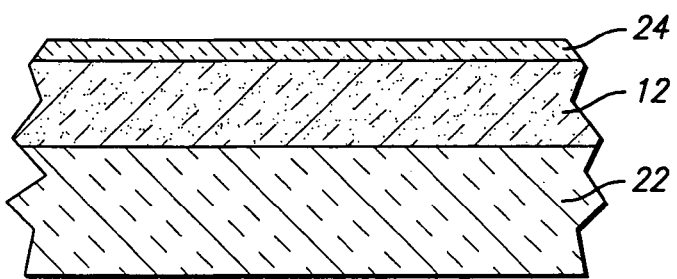
Figure 2C:
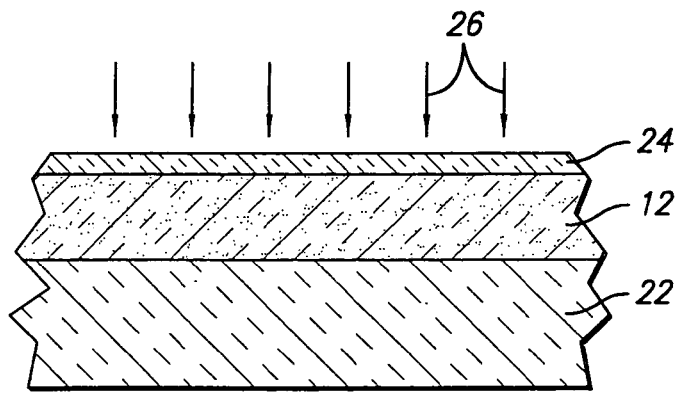
Figure 2D:
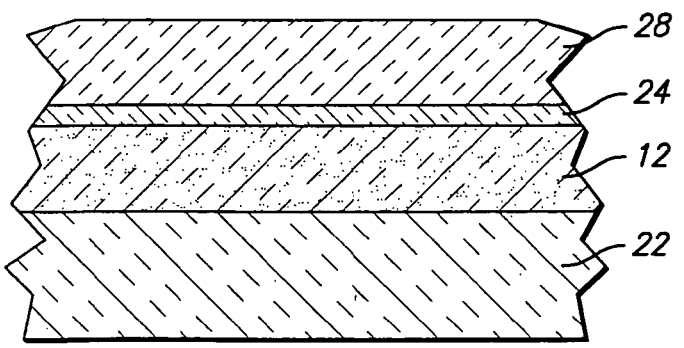
Figure 2E:
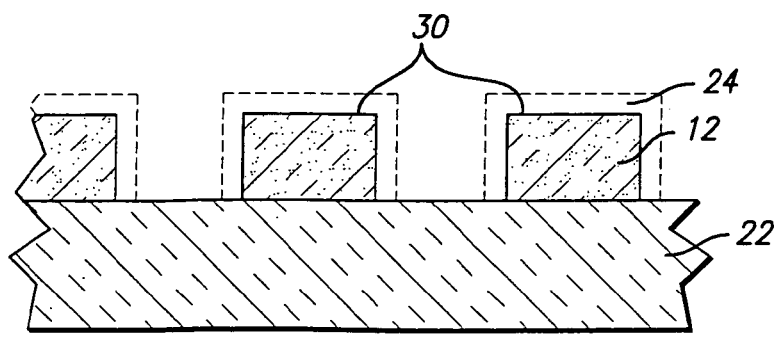

The process steps are depicted in FIGS. 2a–2e, wherein FIG. 2a illustrates formation of a silicon layer 12 on the substrate 22, FIG. 2b illustrates forming a native oxide 24 on the silicon layer, followed by conversion to polysilicon, FIG. 2c illustrates doping the polysilicon with dopant atoms 26, FIG. 2d illustrates formation of a protective layer 28 to aid in activating the dopant atoms, and FIG. 2e illustrates patterning the silicon layer to form electrodes 30.

To convert the amorphous silicon to the higher-conductivity polycrystalline silicon, the amorphous film 12 can be heat-treated (e.g., 650° C. for several hours or at higher temperatures for shorter periods) in an inert (e.g., nitrogen) ambient. If the surface of the amorphous silicon layer 12 is very clean (e.g., free of native oxide), the silicon atoms on the surface can move during the crystallization process, and the surface becomes rough. However, a thin native oxide 24 (FIG. 2b) formed by exposing the deposited amorphous silicon film to air (or other oxidizing species) for a short period of time (e.g., a fraction of one hour) stabilizes the surface adequately during the crystallization process so that the surface of the resulting polycrystalline film remains smooth and suitable for use as an electrode for molecular electronics.

Specifically, a method of forming smooth polycrystalline silicon electrodes for molecular electronic devices is provided. The method comprises:

depositing silicon layer 12 in an amorphous form;

forming native oxide 24 on a surface of the amorphous silicon layer at a temperature between room temperature and 500° C.; and converting the amorphous silicon to polycrystalline silicon by heat-treating at a temperature in a range of 600° to 800° C. for a period of time in a range of 1 minute to 24 hrs, with higher temperatures associated with shorter times, in an inert atmosphere.

The silicon layer 12 is deposited in step (a) by low pressure chemical vapor deposition at a temperature in a range of about 525° to 570° C. using $SiH_4$. Alternatively, $Si_2H_6$ may be used as the source material, and the deposition temperature in that case is in the range of about 450° to 570° C. In either case, the pressure of the deposition is within a range of about 0.02 to 5 Torr, and in both cases, an amorphous layer is formed.

Alternatively, the silicon layer 12 is deposited in step (a) by reduced pressure chemical vapor deposition of between 5 and 150 Torr. At a typical temperature and total pressure of 650° C. and 80 Torr, respectively, a deposition rate of greater than 2 nm/sec is needed to obtain an amorphous layer. The suitable temperature range and deposition rate are directly related, i.e., a higher deposition rate is required at a higher temperature to obtain an amorphous layer.

Although increasing the deposition rate by increasing the pressure (actually the partial pressure of the reactant gas) decreases the processing time, it can cause difficulties. At higher rates (e.g., higher $SiH_4$ partial pressures), gas-phase reactions can occur, leading to particles in the gas phase, which can reach the wafer surface and cause defects. The highest practical deposition rate that avoids particles depends on the temperature, gas residence time, pumping speed, and gas composition. The structure of the deposited silicon also depends on the deposition rate (and thus the pressure). Therefore, increasing the deposition rate by increasing the pressure is not straightforward.

In any event, the thickness of the deposited silicon layer 12 is within a range of about 10 nm to 2 µm.

Next, the native oxide 24 is formed on the amorphous silicon layer 12. This may simply be done by exposing the surface of the amorphous silicon layer to an oxidizing species, e.g., an oxygen-containing gas such as air or oxygen, for a period of time, even at room temperature (about 20° C.), although temperatures as high as 500° C. may be employed. The time of exposure is conveniently less than 1 hr and forms a thin film of the native oxide of about 1 to 2 nm thickness, or somewhat thicker if an elevated temperature is used.

Native oxide is formed on the surface of the amorphous silicon so that the surface remains smooth as the amorphous silicon crystallizes to become polycrystalline silicon (polysilicon) during the first heat treatment. The native oxide should be formed before any substantial heat treatment so that it is present before the crystallization process starts. The native oxide is formed by exposing the surface to an oxidizing species, such as air, at a temperature between room temperature (about 20° C.) and 500° C. before the heat treatment that crystallizes the amorphous silicon. Other types of oxide, such as that formed by exposing the surface to $N_2O$, require an elevated temperature, typically in excess of 600° C., which also initiates the crystallization process, and hence are not preferred. If adequate oxide is not present at the start of the crystallization process, the surface atoms can rearrange, leading to a rough surface. Forming the native oxide at room temperature also minimizes its thickness, preserving the smooth surface of the deposited silicon. (A thicker oxide may form nonuniformly, with the corresponding variations in the amount of Si consumed, and results in undesired surface roughness.)

Finally, the amorphous silicon is converted to polycrystalline silicon, employing the parameters listed above. The conversion is performed in an inert atmosphere, such as nitrogen, argon, helium, or a mixture thereof. The resulting polycrystalline silicon retains the smoothness of the amorphous silicon, wherein the rms surface roughness is less than about 2% of the polycrystalline silicon film thickness.

When a native oxide is used to stabilize the surface, the heat treatment that crystallizes the film is best done at a temperature near 600° C. At markedly higher temperatures (e.g., 900° to 1000° C.), the thin native oxide is not mechanically rigid enough to keep the surface smooth because (1) the surface Si atoms have more energy to rearrange and (2) the oxide becomes mechanically weaker and can become discontinuous. The grains in the silicon film are also larger after crystallizing at 600° C. than when crystallized at a high temperature; at the lower temperatures, the initially nucleated grains grow, rather than having more nuclei form (which would lead to smaller grains). The larger-grain film has fewer grain boundaries, and consequently lower resistivity, and is therefore more suitable as a conducting electrode.

Thus, the first heat treatment that crystallizes the amorphous silicon should be done at a low temperature in the 600° C. range (perhaps up to 700° or 800° C., but not 900° or 1000° C.).

To obtain high conductivity in the electrode, dopant atoms 26 can be implanted into the crystallized film (if they have not been added during the deposition process or before crystallization), as illustrated in FIG. 2c. After depositing a thicker protective layer 28 (e.g., >100 nm silicon oxide), as illustrated in FIG. 2d, the silicon layer 12 is annealed at a high temperature to activate the dopant atoms. The protective layer 28 is then removed before electrode patterning or perhaps used as a part of the patterning process. The patterning can be by lithographically patterning a resist layer and etching (perhaps using the protective layer as an intermediate masking layer), which is a well-known process in semiconductor processing.

As an example, phosphorus atoms may be implanted into the polycrystalline silicon film, employing a suitable implantation energy to place a substantial fraction of the ions in the interior of the silicon film. The determination of the appropriate implantation energy is easily within the ability of the person skilled in the art. Instead of phosphorus atoms, other dopant atoms commonly used to dope silicon and thereby increase its conductivity may alternatively be employed in the practice of the present invention. Examples of such other dopant atoms include arsenic and boron.

Alternatively, dopant atoms can be added from a gas phase, such as during deposition of the amorphous silicon or during crystallization from the amorphous phase to the crystalline phase, although doping during crystallization may be more difficult and hence not as preferred.

For flexibility, it may be preferable to crystallize the silicon before implanting the dopant atoms, rather than after implanting the dopant atoms. The presence of large amounts of dopant (e.g., phosphorus) can change the crystallization rate and other characteristics of the crystallization process, requiring redesign of the process for each different dopant concentration.

The dopant atoms desirably have a concentration within a range of about $1 \times 10^{19}$ to $5 \times 10^{20}$ $cm^{-3}$ and may be added either during the deposition of amorphous silicon or just prior to or after conversion of the amorphous silicon to polycrystalline silicon.

Activation of the dopant atoms is not needed if gas-phase diffusion is used, since that already involves a high temperature and does not cause crystal damage (if done correctly). Instead, a distribution anneal may be used.

However, if activation of the dopant atoms is required, for example, because the dopant atoms were added by implantation, then such activation is performed by first depositing the protective layer 28 on the polycrystalline silicon 12 and then annealing the polycrystalline silicon at an elevated temperature for a period of time.

The protective layer 28 comprises a silicon oxide ($SiO_x$), formed to a thickness of at least 50 nm. $SiO_2$ is preferably employed, since it is generally easier to process. The maximum thickness of the protective layer is about 2 µm.

The annealing to activate the dopant atoms is performed at a temperature within a range of 800° to 1000° C. for a period of time within a range of 10 secs to 4 hrs. The longer annealing times are associated with the lower annealing temperatures. Simple experimentation on test wafers is used to determine when the dopant activation is complete; such procedure is well-known in the semiconductor processing art.

The annealing heat treatment is done after the dopant atoms are added; it activates the dopant and repairs the crystal damage caused by ion implantation of the dopant atoms (if implantation is used). This second heat treatment should be done at a higher temperature, such as 900° C. The higher temperature activates the dopant atoms effectively.

In polycrystalline silicon, annealing at the higher temperature is more critical than in single-crystal silicon. In heavily doped, n-type polycrystalline silicon, dopant atoms precipitate at grain boundaries; for example, phosphorus can precipitate, forming a Si—P phase that degrades the properties of the polysilicon: (1) dopant atoms at the grain boundaries are not electrically active, so the resistivity of the polysilicon increases; (2) the surface can roughen during continued processing because of the different mechanical and chemical properties of the second phase near the grain boundaries. Dopant precipitation at grain boundaries is more severe at lower temperatures, so the dopant activation and any subsequent heat treatments should occur at higher temperatures (e.g., 900° C.) to minimize precipitation.

Following the annealing, the polycrystalline silicon 12 is preferably rapidly cooled, at a rate of greater than 50° C./min, to minimize dopant segregation to grain boundaries and dopant deactivation.

Cooling from the annealing temperature should occur rapidly to minimize the amount of time the polysilicon spends at intermediate temperatures, where the segregation can be significant. (At low temperatures (e.g., below 500° C.), the segregation rate is low, so little segregation can occur during typical processing times.)

Thus, it will be appreciated that the two foregoing heat treatments ((1) conversion from amorphous to polycrystalline and (2) dopant activation and crystal damage repair) are two separate and different steps, which are carried out at different temperatures to optimize different characteristics of the processing and resulting material. Each of the two thermal treatments has a different function, requiring different processing conditions.

The polycrystalline silicon is next patterned to form electrodes 30. The patterning may be done by lithographically patterning a resist layer and etching (perhaps using the protective layer as an intermediate masking layer). This process is conventional and is a well-known step in silicon processing.

The protective layer 28 and the native oxide 24 are then removed prior to further processing to form the switch 10, as shown in FIGS. 1*a*–1*c*. FIG. 2*e* illustrates the patterned electrodes 30 with oxide removed. It will be appreciated that the native oxide 24 may re-form before the switch molecules 16 are added, as shown by the depiction of the native oxide 24 in phantom.

Once the patterned electrodes 30 comprising silicon electrodes 12 are formed, then the layer of switch molecules 16 may be deposited, followed by formation of the electrodes 14 to form the crossed wire switch 10.

EXAMPLE

Poly-silicon electrodes were fabricated as follows: Low-pressure $SiH_4$ CVD was used to deposit 1500 Å of amorphous silicon onto 1100 Å of $SiO_2$ on a Si(100) wafer at 525° C. The film was exposed to air at room temperature for several minutes to form a passivating $SiO_x$ layer and then crystallized under nitrogen gas at 650° C. Poly-silicon films were implanted with 55 KeV $P^+$ ions, and a 1 μm film of $SiO_2$ was deposited by CVD to prevent outgassing of the phosphorus. The dopant P atoms were activated at 1000° C., and then a 6:1 mixture of $NH_4F(aq):HF(aq)$ was used to etch away the $SiO_2$. Electrodes were patterned by using conventional photolithography techniques.

INDUSTRIAL APPLICABILITY

The method of forming smooth polycrystalline silicon electrodes for molecular electronic devices is expected to find use in nanoscale computing and memory circuits.

What is claimed is:

1. A crossed wire molecular electronic device comprising a plurality of bottom electrodes, a plurality of top electrodes, and a layer of switch molecules interposed therebetween, said plurality of bottom electrodes comprising a patterned polycrystalline silicon layer having a thickness within a range of 10 nm to 2 μm, a surface smoothness equivalent to that of amorphous silicon, with an rms surface roughness of less than 2% of said thickness, and dopant atoms, said dopant atoms having a concentration within a range of about $1 \times 10^{19}$ to $5 \times 10^{20}$ $cm^{-3}$ to increase electrical conductivity of said bottom electrodes.

2. The device of claim 1 wherein said polysilicon layer has grains separated by grain boundaries and wherein said concentration of said dopant atoms in said grain boundaries is similar to that in said grains.

3. The device of claim 1 further including a layer of a native oxide formed on the surface of said polycrystalline silicon.

4. The device of claim 1 wherein the top electrodes are disposed over said layer of switch molecules at a non-zero angle with respect to said bottom silicon electrodes.

5. The device of claim 1 wherein said dopant atoms are selected from the group consisting of phosphorus, boron, and arsenic.

6. A crossed wire molecular electronic device comprising a plurality of bottom electrodes, a plurality of top electrodes, and a layer of switch molecules interposed therebetween, said plurality of bottom electrodes comprising a patterned polycrystalline silicon layer having a thickness within a range of 10 nm to 2 μm, a surface smoothness equivalent to that of amorphous silicon, with an rms surface roughness of less than 2% of said thickness, and further including a layer of a native oxide formed on the surface of said polycrystalline silicon.

7. The device of claim 6 wherein said polysilicon layer has dopant atoms, said dopant atoms having a concentration within a range of about $1 \times 10^{19}$ to $5 \times 10^{20}$ $cm^{-3}$.

8. The device of claim 7 wherein said polysilicon layer has grains separated by grain boundaries and wherein said concentration of said dopant atoms in said grain boundaries is similar to that in said grains.

9. The device of claim 6 wherein the top electrodes are disposed over said layer of switch molecules at a non-zero angle with respect to said bottom silicon electrodes.

10. The device of claim 6 wherein said dopant atoms are selected from the group consisting of phosphorus, boron, and arsenic.

* * * * *